(12) United States Patent
Schmidt et al.

(10) Patent No.: US 8,228,331 B2
(45) Date of Patent: Jul. 24, 2012

(54) METHOD AND DEVICE FOR DISPLAYING ORDINATE-ABSCISSA VALUE PAIRS ON A DISPLAY DEVICE

(75) Inventors: Kurt Schmidt, Grafing (DE); Markus Freidhof, Kirchseeon (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 629 days.

(21) Appl. No.: 12/444,475

(22) PCT Filed: Sep. 11, 2007

(86) PCT No.: PCT/EP2007/007920
§ 371 (c)(1),
(2), (4) Date: Apr. 6, 2009

(87) PCT Pub. No.: WO2008/043420
PCT Pub. Date: Apr. 17, 2008

(65) Prior Publication Data
US 2010/0013834 A1    Jan. 21, 2010

(30) Foreign Application Priority Data

Oct. 10, 2006 (DE) .................. 10 2006 047 994

(51) Int. Cl.
*G06T 11/20* (2006.01)
*G09G 5/22* (2006.01)
*G01R 13/00* (2006.01)
(52) U.S. Cl. .................. 345/440; 345/440.1; 702/66
(58) Field of Classification Search .................. 345/440, 345/440.1; 702/66
See application file for complete search history.

(56) References Cited

U.S. PATENT DOCUMENTS 3,792,464 A * 2/1974 Hamada et al. ............ 345/440.1
4,701,937 A * 10/1987 Wan et al. .................... 375/242
5,028,914 A * 7/1991 Povenmire .................. 345/440.1
(Continued)

FOREIGN PATENT DOCUMENTS
DE        19639680 A1    8/1997
(Continued)

OTHER PUBLICATIONS

International Preliminary Report on Patentability, PCT/EP2007/007920, May 14, 2009, pp. 1-11.
(Continued)

Primary Examiner — M Good Johnson
(74) Attorney, Agent, or Firm — Ditthavong Mori & Steiner, P.C.

(57) ABSTRACT

A method for displaying ordinate-abscissa value pairs on a display device with discrete display points in the abscissa and ordinate direction, of which the abscissa resolution is reduced by comparison with the abscissa resolution of the ordinate-abscissa value pairs, determines the respective maximum and minimum ordinate value of every ordinate-abscissa value pair, which is disposed within the half spacing distance of the abscissa value relative to the adjacent abscissa value to the right and left of the display points, and replaces all ordinate-abscissa value pairs, which are disposed within the half spacing distance of the respective abscissa value relative to the respective adjacent abscissa value to the right and left of the display points, with an area between the maximum and the minimum ordinate value and the half spacing distance of the abscissa value relative to the adjacent abscissa value to the right and left of the display points.

7 Claims, 3 Drawing Sheets

U.S. PATENT DOCUMENTS

| | | | |
|---|---|---|---|
| 5,103,402 A | | 4/1992 | Morton et al. |
| 5,488,698 A | * | 1/1996 | Oliver et al. .................. 358/1.11 |
| 5,550,963 A | * | 8/1996 | Siegel et al. ..................... 345/440 |
| 6,184,898 B1 | * | 2/2001 | Rice et al. ..................... 345/440 |
| 6,934,646 B2 | * | 8/2005 | Montijo ........................ 702/66 |
| 7,571,064 B2 | * | 8/2009 | Moulios ........................ 702/66 |
| 2003/0201993 A1 | | 10/2003 | Nakayama |
| 2004/0017366 A1 | | 1/2004 | Narita |
| 2004/0078157 A1 | | 4/2004 | Motijo |

FOREIGN PATENT DOCUMENTS

| | | |
|---|---|---|
| DE | 69434238 T2 | 12/2005 |
| EP | 0209226 A2 | 1/1987 |
| EP | 0343906 B1 | 11/1989 |
| EP | 0701137 A2 | 3/1996 |
| EP | 0937987 A2 | 8/1999 |
| GB | 2271043 A | 3/1994 |
| JP | 04007684 A | 1/1992 |
| JP | 06102291 A | 4/1994 |
| JP | 07020153 A | 1/1995 |
| WO | 2005088348 A1 | 9/2005 |

OTHER PUBLICATIONS

International Search Report, WO 2008/043420 A1, Rohde & Schwarz GmbH, Apr. 17, 2008, pp. 16-21.

* cited by examiner

METHOD AND DEVICE FOR DISPLAYING ORDINATE-ABSCISSA VALUE PAIRS ON A DISPLAY DEVICE

CROSS-REFERENCE TO RELATED APPLICATION

The present application claims priority to German Patent Application No. 10 2006 047 994.7, filed on Oct. 10, 2006, and PCT Application No. PCT/EP2007/007920, filed on Sep. 11, 2007, the entire contents of which are herein incorporated by reference.

BACKGROUND OF THE INVENTION

1. Field of the Invention

The invention relates to a method and a device for displaying ordinate-abscissa value pairs on a display device.

2. Discussion of the Background

Display devices with discrete display points—pixel graphics—are currently used as standard for the graphic display of measured values in measuring instruments or systems, for example, spectrum analysers and network analysers. The resolution of such display devices is limited because of the limited number of display points in ordinate and abscissa direction. The maximum resolution of display devices of this kind is currently, for example, around 1000·600 display points.

With a spectrum analyser according to the prior art, as shown in FIG. 1, with a low-pass filter 1 for frequency limitation of the signal to be displayed with regard to the sampling theorem, an analog-digital converter 2 for digitization of the signal to be displayed, a fast Fourier transformer 3 (FFT) for calculating the discrete Fourier spectral lines by fast Fourier transform, a modulus former 4 for determining the power-spectral lines, a log unit 5 for compression of the power-spectral lines scattering over a wide signal range to the display range of the display device and a display device 6 with discrete display points in ordinate and abscissa direction for displaying the discrete power-spectral lines, the power spectrum to be displayed provides in the abscissa direction a resolution at the level of the FFT length $N_{FFT}$ of the FFT transformer 3—typically $N_{FFT}=2048$—and in the ordinate direction a resolution at the level of the word width of the log unit 5—typically $2^{16}=56636$ level stages. Since the resolution of the measured values to be displayed is greater both in abscissa and also in ordinate direction than the resolution of the display device 6, the resolution of the measured values to be displayed must be reduced before implementing the display of the measured values on the display device 6.

Regarding the prior art, reference is made to U.S. Pat. No. 5,103,402.

A reduction in the resolution of the measured values to be displayed in the abscissa direction leads disadvantageously to a loss of information in the measured values to be displayed in the ordinate direction. Strong fluctuations in the measured values to be displayed over a relatively wide value range in the ordinate direction accordingly bring about an unacceptable loss of accuracy, in particular in the case of a real-time data acquisition and display.

SUMMARY OF THE INVENTION

Embodiments of the invention advantageously increase the accuracy with a real-time data display of measured values registered in real time, of which the resolution in ordinate and abscissa direction is greater than the resolution of the display device, and to indicate a corresponding method and a corresponding device.

According to the invention, by reducing the resolution of the registered measured values in the abscissa direction to the resolution of the display devices in abscissa direction, the maximum and minimum value of the ordinate values of all ordinate-abscissa value pairs, which are disposed within the half spacing distance of the respective abscissa value to be displayed from the respective adjacent abscissa value to the right and to the left, are determined and the individual ordinate-abscissa value pairs are replaced as an area between the determined maximum and minimum value and the half spacing distance of the respective abscissa value to be displayed from the respective adjacent abscissa value to the right and to the left. In this manner, the information regarding the value range of the individual ordinate values of the ordinate-abscissa value pairs of the measured values registered at a resolution increased by comparison with the resolution of the display device are not lost in the display of the measured values on the display device.

If the ordinate values of two adjacent measured values provide significantly-different values—for example, the registered frequency spectrum of a transmission signal filtered with a narrow bandpass filter, the ordinate values disposed at the half spacing distance between the abscissa values of the two adjacent measured values are determined through a linear interpolation of the ordinate values of the two adjacent measured values and taken into consideration for the determination of the maximum and minimum value of the ordinate values of all ordinate-abscissa value pairs within the half spacing distance of the respective abscissa values to be displayed from the respective adjacent abscissa value to the right and to the left.

BRIEF DESCRIPTION OF THE DRAWINGS

An exemplary embodiment of the method according to the invention and the device according to the invention for displaying ordinate-abscissa value pairs on a display device is provided in detail below with reference to the drawings. The drawings are as follows.

DETAILED DESCRIPTION OF EXEMPLARY EMBODIMENTS OF THE INVENTION

Figure 2:
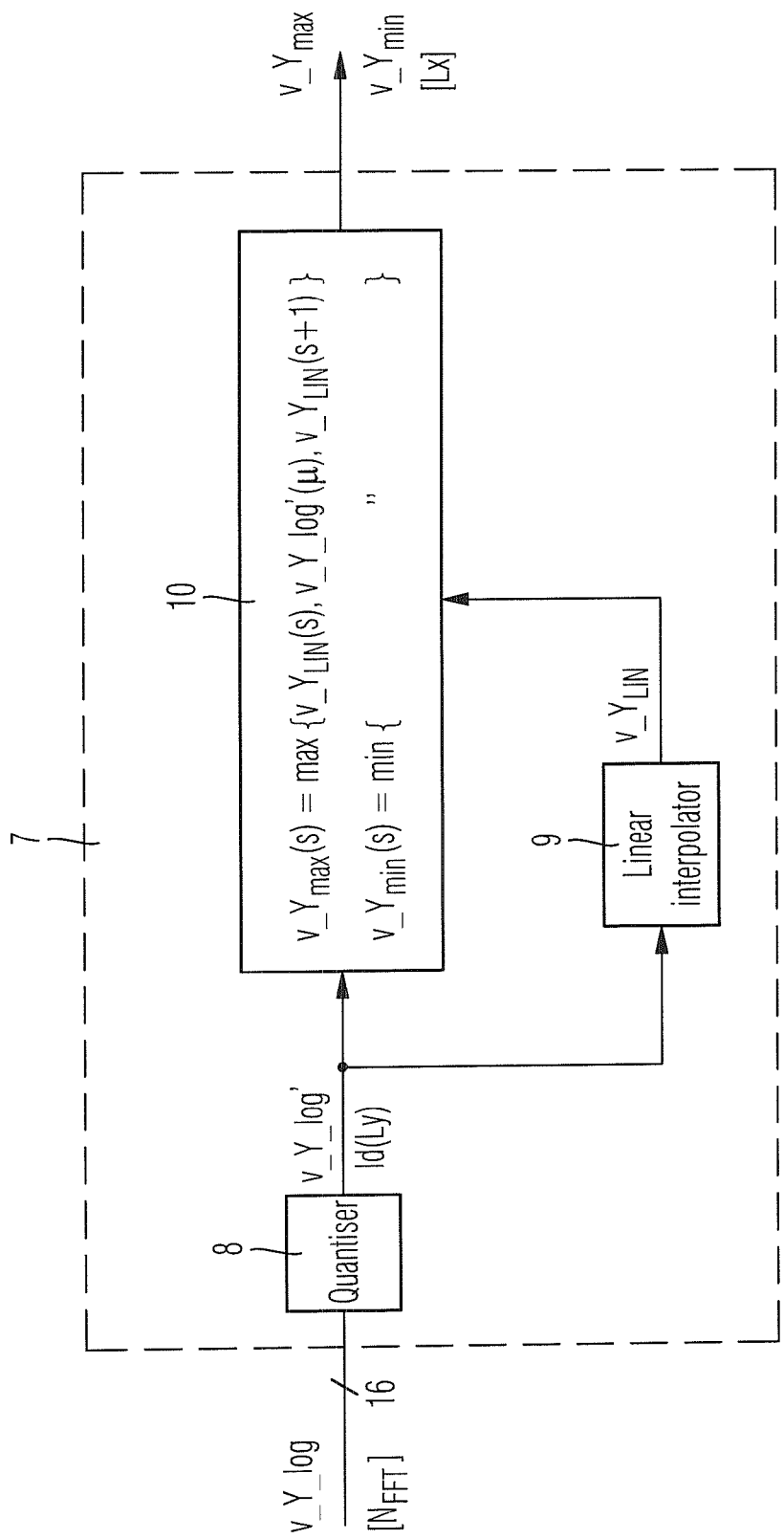
FIG. 2 shows a block-circuit diagram of a device according to the invention for displaying ordinate-abscissa value pairs on a display device.

The device 7 according to the invention for displaying ordinate-abscissa value pairs on a display device 6 shown in FIG. 2 receives from the log unit 5 a vector v_Y-log with a total of $N_{FFT}$ discrete logged level values Y-log of the power-spectral lines to be displayed in the cycle of the FFT calculation. In a quatizer 8, the discrete logged level values Y-log of the power-spectral lines to be displayed, which are present as ordinate values of a total of $N_{FFT}$ ordinate-abscissa value pairs, are quatized with regard to the total of Ly possible display points v_Y_log' of the pixel graphic of the display device 6 in the ordinate direction.

In an interpolator 9, which is preferably designed as a linear interpolator, for each of the total of Lx abscissa values s displayable on the display device 6, the ordinate values $v\_Y_{lin}(s)$ and $v\_Y_{lin}(s+1)$ of additional ordinate-abscissa value pairs at the half spacing distance of the respective abscissa value s relative to the next adjacent abscissa value to the left and to the right s−1 and s+1 are calculated by means of interpolation of the two respectively nearest, quatized, discrete, logged level values Y_log' of the power-spectral lines to be displayed.

In an extreme-value former 10, the maximum value $v\_Y_{max}(s)$ and the minimum value $v\_Y_{min}(s)$ of all of the quatized, discrete, logged level values Y_log' of the power-spectral lines to be displayed, which are disposed within the half spacing distance of the respective abscissa value s relative to the next adjacent abscissa value to the left and to the right s−1 and s+1 with the addition of the interpolated ordinate values $v\_Y_{lin}(s)$ and $v\_Y_{lin}(s+1)$ at the half spacing distance of the respective abscissa value s relative to the next adjacent abscissa value to the left and to the right s−1 and s+1 are determined for every abscissa value s of the display device 6.

The total of Lx maximum and minimum values $v\_Y_{max}$ and $v\_Y_{min}$ determined in the extreme-value former 10, which represent level values of the power-spectral lines to be displayed at the total of Ly displayable level stages of the display device 6, are transferred to the display device 6 as ordinate values of the ordinate-abscissa value pairs to be displayed in the pixel graphic on the display device 6.

Figure 1:
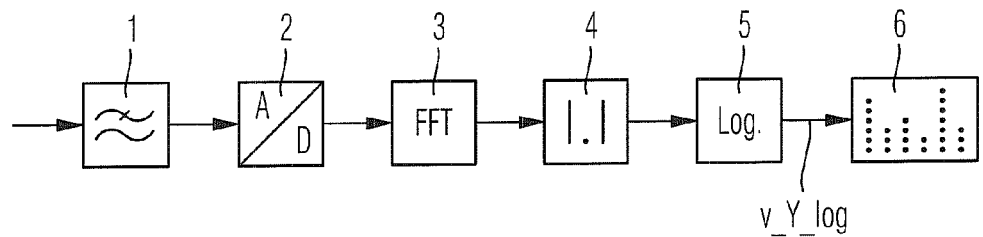
FIG. 1 shows a block-circuit diagram of a spectrum analyser according to the prior art.
Figure 3A:
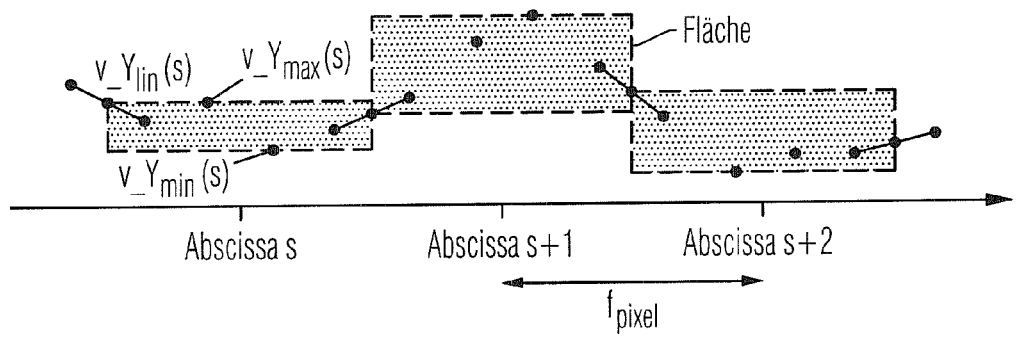
FIGS. 3A, 3B show an ordinate-abscissa display of ordinate-abscissa value pairs with high and low data reduction in the abscissa direction.
Figure 3B:
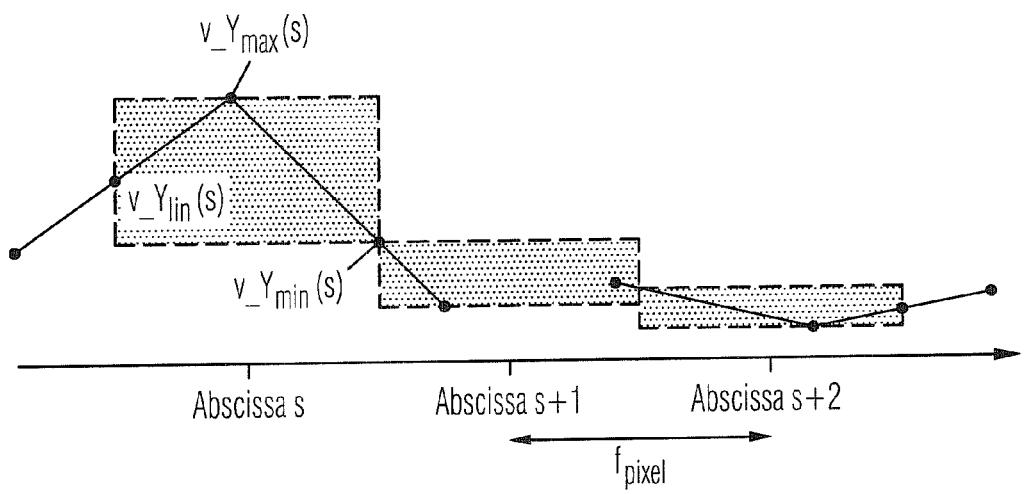

FIGS. 3A and 3B present, for a different FFT length of the FFT transformer—double FFT length in FIG. 3A by comparison with the FFT length in FIG. 3B—with a given pixel raster $f_{pixel}$ of the display device 6 in the abscissa direction, the determination of the maximum value $v\_Y_{max}(s)$ and of the minimum value $v\_Y_{min}(s)$ in the respective abscissa value s and of the linear, interpolated ordinate value $v\_Y_{lin}(s)$ in the half spacing distance between the respective abscissa value s and its adjacent abscissa value to the left and to the right s−1 and s+1.

FIGS. 3A and 3B finally also show the shaded area displayed on the display device 6 between the respective maximum value $v\_Y_{max}(s)$ and minimum value $v\_Y_{min}(s)$ and the half spacing distances between the respective abscissa value s and its adjacent abscissa value to the left and to the right s−1 and s+1, which is to replace the ordinate-abscissa value pairs disposed within the shaded area of the quatized, logged level values Y_log' of the power-spectral lines to be displayed on the display device 6.

Figure 4:
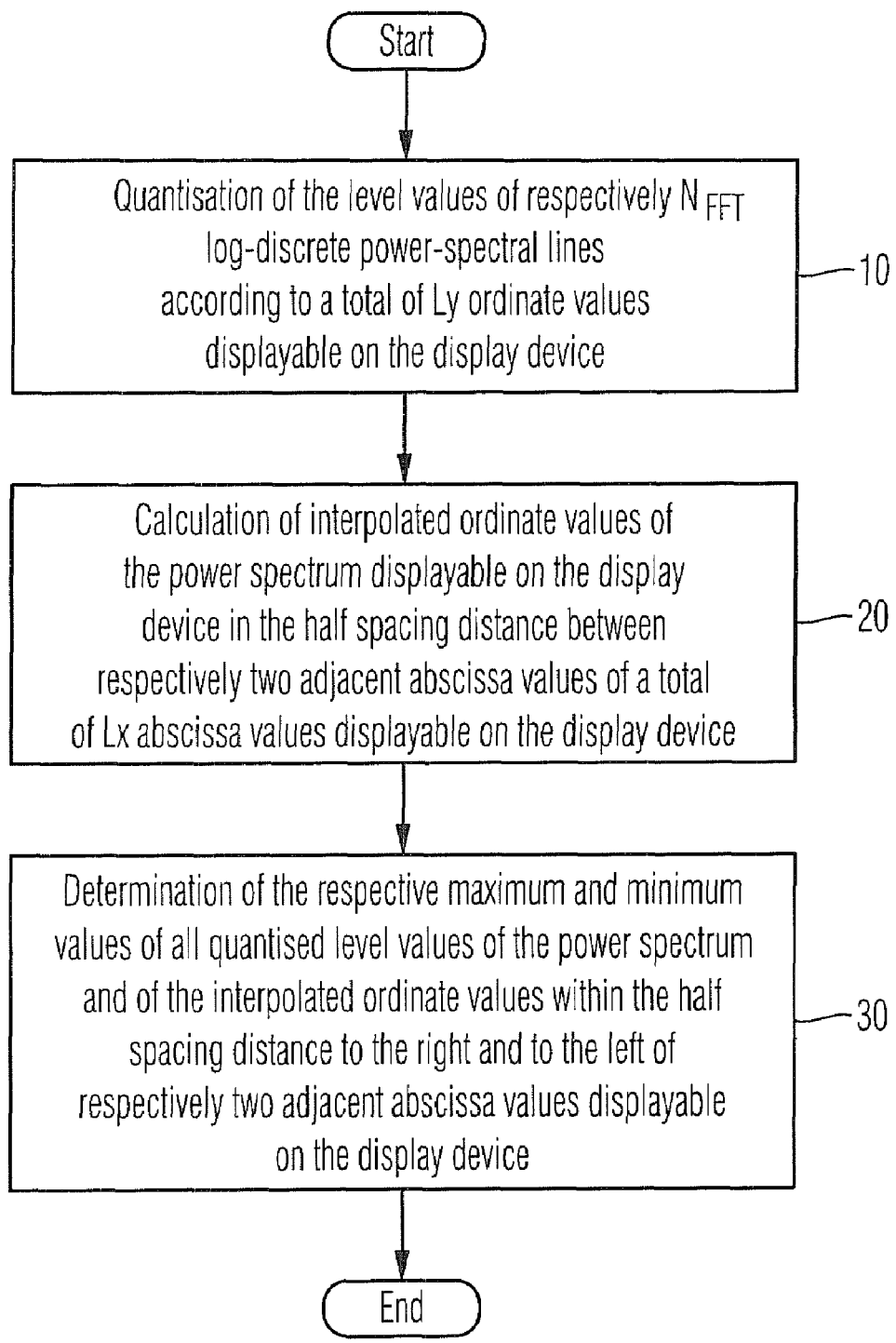
FIG. 4 shows a flow chart of the method according to the invention for displaying ordinate-abscissa value pairs on a display device.

The following section describes the method according to the invention for displaying ordinate-abscissa value pairs on a display device with reference to FIG. 4.

In the first procedural stage S10, the logged, discrete level values v_Y_log of the power spectrum determined by the log unit 5 within one FFT cycle of the FFT transformer 3 are subjected to a quatization in a quatizer 8, in which the level values at the output of the log unit 5, which can assume a total of 65536 different values with a word width of 16 bits, are reduced to the total of Ly ordinate values displayable on the display device 6. For the binary display of the quatized, logged, discrete level values v_Y_log' at the output of the quatizer 8, ld(Ly) bits are therefore required.

In the next procedural stage S20, for all of the Lx abscissa values displayable on the display device 6, the interpolated ordinate values $v\_Y_{lin}$ of the power spectrum at the half spacing distance in each case between two adjacent abscissa values are calculated by means of interpolation, in particular by means of linear interpolation, from the respective quatized level values of the power spectrum adjacent to the right and to the left determined by means of FFT transformation.

In the final procedural stage S30, for all of the Lx abscissa values displayable on the display device 6 all of the ordinate-abscissa value pairs disposed within the respective half spacing distance relative to the respective adjacent abscissa value to the right and to the left calculated and logged from quatized level values of the power spectrum by means of FFT transformation and level values of the power spectrum interpolated by means of interpolation, the respective maximum and minimum values $v\_Y_{max}(s)$ and $v\_Y_{min}(s)$ are determined and transmitted to the display device 6 for display as an area between the maximum and minimum value $v\_Y_{max}(s)$ and $v\_Y_{min}(s)$ for every abscissa value s displayable on the display device 6.

The invention is not restricted to the embodiment displayed. Alongside the linear interpolation, other, higher-order interpolation methods are also covered by the invention.

The invention claimed is:

1. A method for displaying ordinate-abscissa value pairs on a display device with discrete display points in abscissa and ordinate direction, of which the abscissa resolution and the ordinate resolution is reduced by comparison with the abscissa resolution and the ordinate resolution of the ordinate-abscissa value pairs, said method comprising:
    determining interpolated ordinate values of additional ordinate-abscissa value pairs through interpolation of the ordinate-abscissa value pairs to be displayed in the respective half spacing distances between the respective abscissa values relative to the respective adjacent abscissa value to the right and to the left of the display points;
    determining the respective maximum ordinate value and the respective minimum ordinate value of every ordinate-abscissa value pair and of every additional ordinate-abscissa value pair, which is disposed within the half spacing distance of the respective abscissa value relative to the respective adjacent abscissa value to the right and to the left of the display points; and
    replacing all ordinate-abscissa value pairs and all additional ordinate-abscissa value pairs, which are disposed within the half spacing distance of the respective abscissa value relative to the respective adjacent abscissa value to the right and to the left of the display points, with an area between the respective maximum and the respective minimum ordinate value and the half spacing distance of the respective abscissa value relative to the respective adjacent abscissa value to the right and to the left of the display points.

2. The method for displaying ordinate-abscissa value pairs according to claim 1,
    wherein the interpolation is a linear interpolation.

3. The method for displaying ordinate-abscissa value pairs according to claim 2,
    wherein the abscissa values of the ordinate-abscissa value pairs to be displayed are sampling times of a sampled time signal.

4. The method for displaying ordinate-abscissa value pairs according to claim 3,
    wherein the abscissa values of the ordinate-abscissa value pairs to be displayed are frequency values of a sampled frequency spectrum.

5. The method for displaying ordinate-abscissa value pairs according to claim 1, wherein the abscissa values of the ordinate-abscissa value pairs to be displayed are sampling times of a sampled time signal.

6. The method for displaying ordinate-abscissa value pairs according to claim 1, wherein the abscissa values of the ordinate-abscissa value pairs to be displayed are frequency values of a sampled frequency spectrum.

7. A device for displaying ordinate-abscissa value pairs on a display device with discrete display points in abscissa and ordinate direction, of which the abscissa resolution and the ordinate resolution is reduced by comparison with the abscissa resolution and the ordinate resolution of the ordinate-abscissa value pairs, comprising:

an interpolator for a calculation of interpolated ordinate values of additional ordinate-abscissa value pairs at the half spacing distances between respective abscissa values and respective adjacent abscissa values to the right and to the left of the display points; and an extreme-value former for determination of the respective maximum and minimum ordinate value of all ordinate-abscissa value pairs and all additional ordinate-abscissa value pairs to be displayed, which are disposed within the half spacing distance between the respective abscissa value relative to the respective adjacent abscissa value to the right and to the left of the display points.

* * * * *